United States Patent
Ohba et al.

(10) Patent No.: US 8,954,813 B2
(45) Date of Patent: Feb. 10, 2015

(54) MEMORY SYSTEM AND TEST METHOD THEREOF

(71) Applicant: Kabushiki Kaisha Toshiba, Tokyo (JP)

(72) Inventors: Hiroyuki Ohba, Kanagawa (JP);
Nobuhiro Ono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 13/768,157

(22) Filed: Feb. 15, 2013

(65) Prior Publication Data
US 2013/0219235 A1    Aug. 22, 2013

(30) Foreign Application Priority Data

Feb. 17, 2012    (JP) ................................ 2012-033289

(51) Int. Cl.
| | |
|---|---|
| *G01R 31/28* | (2006.01) |
| *G11C 29/12* | (2006.01) |
| *G11C 29/16* | (2006.01) |
| *G11C 29/26* | (2006.01) |
| *G11C 29/04* | (2006.01) |

(52) U.S. Cl.
CPC ............... *G11C 29/12* (2013.01); *G11C 29/16* (2013.01); *G11C 29/26* (2013.01); *G11C 2029/0401* (2013.01)
USPC .......................................... 714/733; 714/744

(58) Field of Classification Search
USPC ................................................. 714/733, 744
See application file for complete search history.

(56) References Cited

U.S. PATENT DOCUMENTS

| | | | |
|---|---|---|---|
| 7,584,070 B2 | 9/2009 | Kotani et al. | |
| 2007/0156993 A1* | 7/2007 | Alexander et al. | 711/167 |
| 2009/0063917 A1* | 3/2009 | Tokunaga et al. | 714/719 |
| 2009/0245001 A1* | 10/2009 | Hiraide | 365/201 |
| 2010/0073860 A1 | 3/2010 | Moriai et al. | |

FOREIGN PATENT DOCUMENTS

| | | |
|---|---|---|
| JP | 03-245219 A | 10/1991 |
| JP | 4-336634 | 11/1992 |
| JP | 2988518 | 10/1999 |
| JP | 2003-529866 A | 10/2003 |
| JP | 2006-23900 | 1/2006 |

(Continued)

OTHER PUBLICATIONS

Office Action issued Jul. 1, 2014 in Japanese Patent Application No. 2012-033289 (with English language translation).

(Continued)

*Primary Examiner* — M. Mujtaba K Chaudry
(74) *Attorney, Agent, or Firm* — Oblon, Spivak, McClelland, Maier & Neustadt, L.L.P.

(57) ABSTRACT

According to one embodiment, two memory systems each including a memory and a controller are connected via a communication line. The controller includes a testing unit that performs a self-test process on the memory, a communication unit that communicates with the counterpart controller, and a status output unit. The communication unit performs a startup synchronization process which is performed before the self-test process and a termination synchronization process which is performed after the self-test process. The testing unit obtains a comprehensive test result from the test results of the two memory systems, and the status output unit of one memory system outputs the comprehensive test result.

20 Claims, 9 Drawing Sheets

(56) References Cited

FOREIGN PATENT DOCUMENTS

| | | |
|---|---|---|
| JP | 2007-241839 A | 9/2007 |
| JP | 2007-272357 A | 10/2007 |
| JP | 2009-187185 A | 8/2009 |
| JP | 2010-79445 | 4/2010 |

OTHER PUBLICATIONS

Office Action issued Oct. 28, 2014 in Japanese Patent Application No. 2012-033289 (with English translation).

* cited by examiner

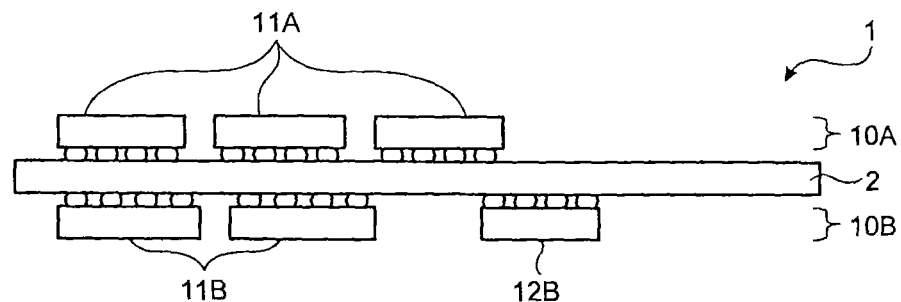
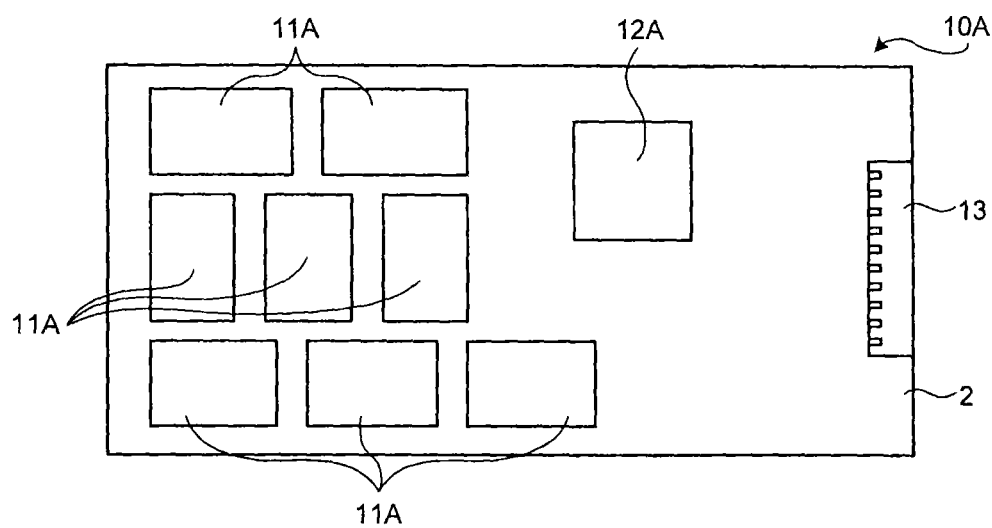
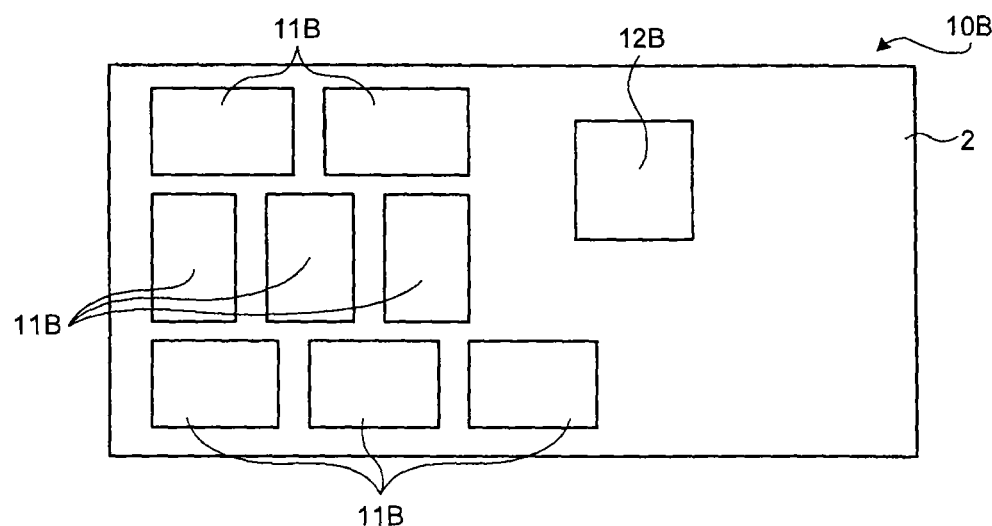

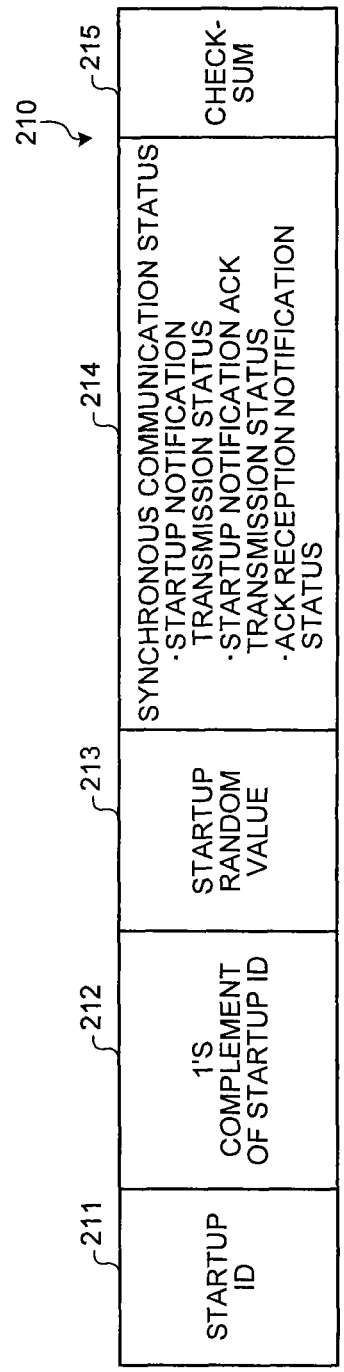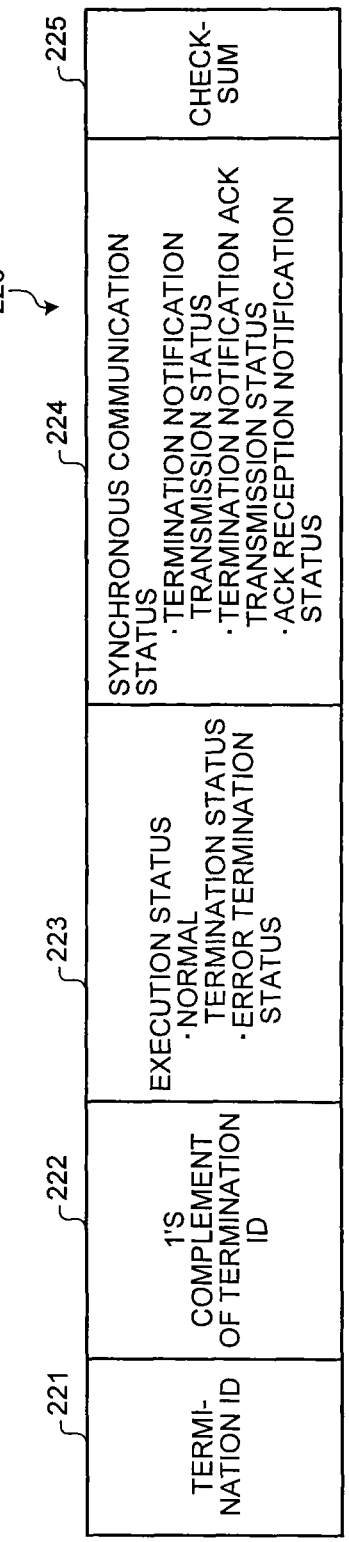

FIG.4

| TEST RESULT OF SSD 10A | TEST RESULT OF SSD 10B | COMPREHENSIVE TEST RESULT |
|---|---|---|
| NORMAL TERMINAION | NORMAL TERMINAION | NORMAL TERMINAION |
| NORMAL TERMINAION | ERROR TERMINATION | ERROR TERMINATION |
| ERROR TERMINATION | NORMAL TERMINAION | ERROR TERMINATION |
| ERROR TERMINATION | ERROR TERMINATION | ERROR TERMINATION |

US 8,954,813 B2

MEMORY SYSTEM AND TEST METHOD THEREOF

CROSS-REFERENCE TO RELATED APPLICATIONS

This application is based upon and claims the benefit of priority from Japanese Patent Application No. 2012-33289, filed on Feb. 17, 2012; the entire contents of which are incorporated herein by reference.

FIELD

Embodiments described herein relate generally to a memory system and a test method thereof.

BACKGROUND

In recent years, storage capacity of SSDs that use a NAND-type flash memory device has been increased. A method of conducting self-test on individual SSDs when a RAID0 is configured using two SSDs, for example, has not been proposed.

BRIEF DESCRIPTION OF THE DRAWINGS

FIGS. 1A to 1C are views schematically illustrating an example of a configuration of a memory system according to an embodiment;

FIGS. 3A and 3B are views illustrating an example of a configuration of a synchronization data frame;

FIG. 4 is a view illustrating an example of comprehensive test result information;

DETAILED DESCRIPTION

Figure 2:
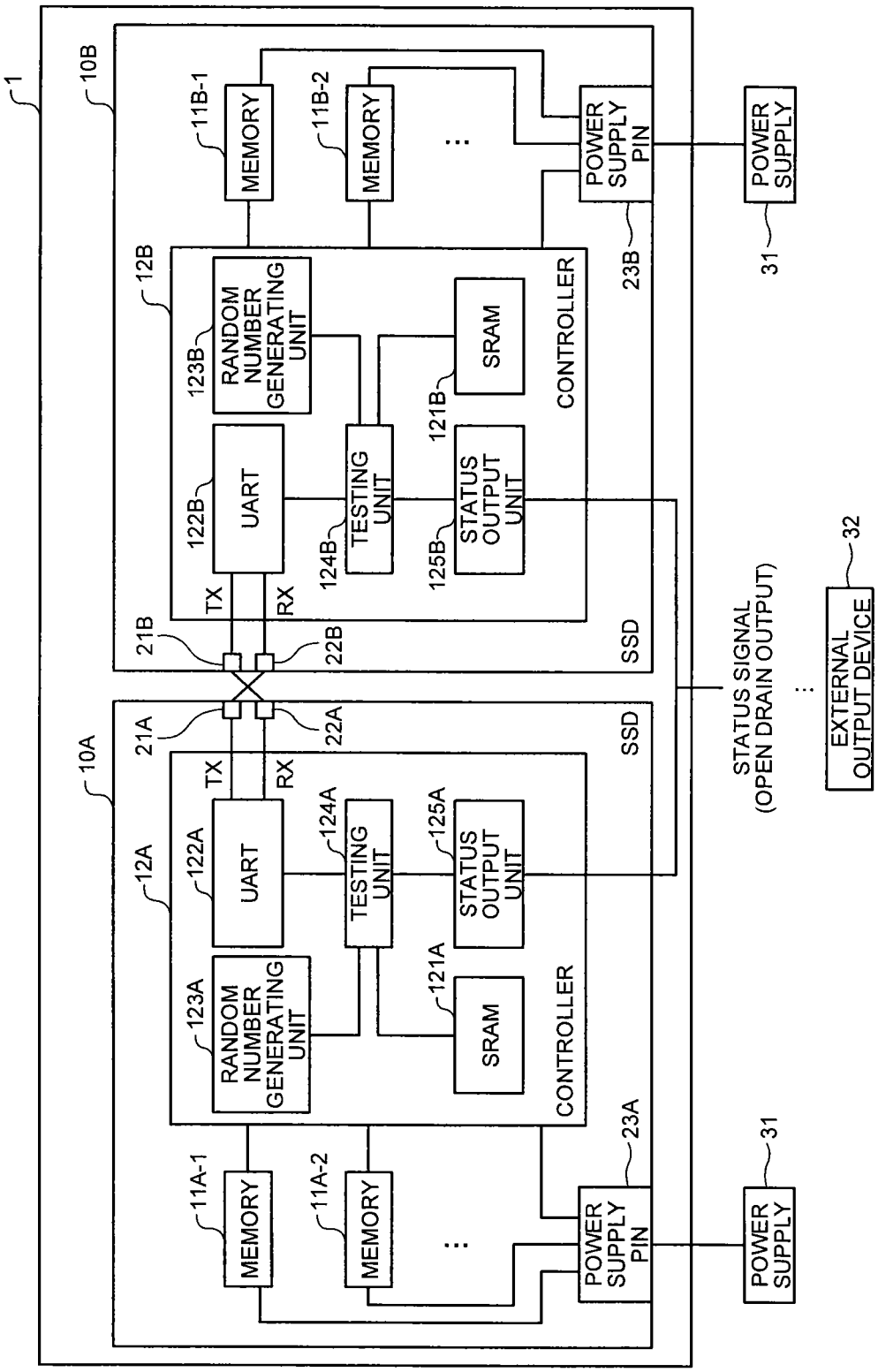
FIG. 2 is a block diagram schematically illustrating an example of a functional configuration of the memory system according to the embodiment.

In general, according to one embodiment, there is provided a memory system in which two storage devices each including a storage unit and a controller that transmits data between a host device and the storage unit are connected via a communication line so that bidirectional communication can be performed. The controller includes: a testing unit that performs a self-test process on the storage unit connected to a subject controller; a communication unit that performs communication with a counterpart controller via the communication line; and a test result output unit that outputs test results of the two storage devices obtained by the testing unit. The communication unit performs a first synchronization process making the testing unit of each of the two storage devices execute the self-test process at a predetermined point and a second synchronization process in which a termination synchronization frame including a test result of a subject storage device is transmitted to the counterpart storage device via the communication line after the self-test process is terminated, and the termination of the self-test process is synchronized between the two storage devices. The testing unit performs a comprehensive test result determination process of obtaining a comprehensive test result from the test result of the subject storage device and the test result of the counterpart storage device obtained in the second synchronization process. The test result output unit of one of the two storage devices outputs the comprehensive test result obtained by the testing unit.

Hereinafter, a memory system and a test method thereof according to an embodiment will be described in detail with reference to the accompanying drawings. The present invention is not limited to this embodiment.

FIGS. 1A to 1C are views schematically illustrating an example of a configuration of a memory system according to an embodiment, in which FIG. 1A is a side view, FIG. 1B is a top view of FIG. 1A, and FIG. 10 is a bottom view of FIG. 1A. The memory system 1 has a configuration in which elements including a memory chip (memory) 11A formed of a nonvolatile memory device and a controller chip (controller) 12A for controlling the memory chip 11A are disposed on an upper surface of a printed substrate 2, and elements including a memory chip (memory) 11B formed of a nonvolatile memory device and a controller chip (controller) 12B for controlling the memory chip 11B are disposed on a lower surface of the printed substrate 2. Each element is disposed such that an external terminal such as a bump of each element is connected to a land (not illustrated) formed on the printed substrate 2. Moreover, the land of the printed substrate 2 is connected to a wiring pattern (not illustrated). Further, a connector 13 that is connected to a host device, for example, such as a personal computer is formed on the upper surface of the printed substrate 2.

In the example of FIGS. 1A to 10, eight memory chips 11A and one controller chip 12A are disposed on the upper surface of the printed substrate 2, which form one solid state drive (SSD) 10A. Moreover, eight memory chips 11B and one controller chip 12B are disposed on the lower surface of the printed substrate 2, which form one SSD 10B. That is, the SSD 10A on the upper surface and the SSD 10B on the lower surface can read and write data independently from each other. A nonvolatile semiconductor memory device such as a NAND-type flash memory device can be used as the memory chips 11A and 11B.

FIG. 2 is a block diagram schematically illustrating an example of a functional configuration of the memory system according to the embodiment. As described above, the memory system 1 includes two SSDs 10A and 10B, in which the SSD 10A includes memories 11A-1, 11A-2, and so on, and the controller 12A that performs data management or the like on these memories 11A-1, 11A-2, and so on, and the SSD 10B includes memories 11B-1, 11B-2, and so on, and the controller 12B that performs data management or the like on these memories 11B-1, 11B-2, and so on. For example, the memories 11A-1, 11A-2, and so on and the memories 11B-1, 11B-2, and so on may be NAND-type flash memory devices, dynamic random access memories (DRAMs), or the like. A power supply voltage is supplied from an external power supply circuits 31 to the controllers 12A and 12B, the memories 11A-1, 11A-2, and so on, and the memories 11B-1, 11B-2, and so on via power supply pins 23A and 23B on the printed substrate 2. In this embodiment, it is assumed that the memories 11A-1 and 11B-1 are configured as memories such as a NAND-type flash memory device, which are capable of storing data in a nonvolatile manner. It is also assumed that the memories 11A-2 and 11B-2 are configured as memories such as a DRAM, which are used for transferring data between a host device (not illustrated) and the memories 11A-1 and 11B-1.

The controllers 12A and 12B have a function of controlling transferring of data between the memories 11A-1 and 11B-1 and a host device (not illustrated) and managing the storage location of data in the memories 11A-1, 11B-1, 11A-2, and 11B-2 and also have a function of performing self-test on the memories 11A-1, 11A-2, and so on and the memories 11B-1, 11B-2, and so on that constitute the SSDs 10A and 10B, respectively, and static random access memories (SRAMs) 121A and 121B. FIG. 2 illustrates constituent components related to the function of performing self-test on memories.

The controllers 12A and 12B include SRAMs 121A and 121B, communication units 122A and 122B, random number generating units 123A and 123B, testing units 124A and 124B, and status output units 125A and 125B. The SRAMs 121A and 121B are memories which are used when the controllers 12A and 12B executes programs, for example.

The communication units 122A and 122B have functions of performing bidirectional communication with the controllers 12B and 12A of the other SSDs 10B and 10A provided on the printed substrate 2, transmitting the status of the subject SSDs 10A and 10B at the time of power-on, during the self-test of the testing units 124A and 124B, and at the termination of the self-test, and receiving the status of the counterpart SSDs 10A and 10B. The example of FIG. 2 illustrates a case in which universal asynchronous receiver transmitters (UARTs) are used as the communication units 122A and 122B. Thus, transmission ports 21A and 21B and reception ports 22A and 22B are provided in the SSDs 10A and 10B, respectively, and the SSDs 10A and 10B are connected by cables so that the transmission port 21A of the SSD 10A is connected to the reception port 22B of the SSD 10B, and the reception port 22A of the SSD 10A is connected to the transmission port 21B of the SSD 10B. Moreover, a data frame to be described later is transmitted and received via serial communication between the two communication units 122A and 122B.

As described above, the communication units 122A and 122B transmit and receive a startup synchronization data frame during power-on so that self-test is executed in synchronization with a counterpart SSD and transmit and receive a termination synchronization data frame during self-test or at the termination of the self-test so that the self-test is terminated. FIGS. 3A and 3B are views illustrating an example of a configuration of a synchronization data frame, in which FIG. 3A illustrates an example of a configuration of a startup synchronization data frame, and FIG. 3B illustrates an example of a configuration of a termination synchronization data frame.

A startup synchronization data frame 210 includes the respective fields of a startup ID 211 that indicates the start of the startup synchronization data frame 210, a 1's complement 212 of the startup ID, a startup random value 213 which is the value acquired from the random number generating units 123A and 123B, a synchronous communication status 214 that indicates the status of a subject SSD during startup, and a checksum 215 used for checking whether the data of the startup synchronization data frame 210 has an abnormality.

The synchronous communication status 214 indicates the status of a subject SSD. In this example, it is assumed that the synchronous communication status 214 includes a startup notification transmission status, a startup notification ACK transmission status, and an ACK reception notification status as its status and indicates the present status by setting a flag to the respective statuses. The startup notification transmission status indicates whether the startup synchronization data frame 210 in which a flag is set to "startup notification transmission status" has been transmitted to the counterpart SSD for the first time after power-on. The startup notification ACK transmission status indicates after receiving the startup synchronization data frame 210 in which a flag is set to the "startup notification transmission status", whether the subject SSD has transmitted the startup synchronization data frame 210 in which a flag is set to "startup notification ACK transmission status" which is a response to the startup synchronization data frame 210. Moreover, the ACK reception notification status indicates whether the startup synchronization data frame 210 in which a flag is set to the "ACK reception notification status" that indicates that the startup synchronization data frame 210 in which a flag is set to the "startup notification ACK transmission status" is received from the counterpart SSD has been transmitted.

Moreover, the termination synchronization data frame 220 includes the respective fields of a termination ID 221 that indicates the start of the termination synchronization data frame 220, a 1's complement 222 of the termination ID, an execution status 223 that indicates the test result obtained by the testing units 124A and 124B, a synchronous communication status 224 that indicates the status of a subject SSD during termination, and a checksum 225 used for checking whether the data of the termination synchronization data frame 220 has an abnormality.

The execution status 223 indicates a termination status of the self-test by the testing units 124A and 124B. In this example, it is assumed that the execution status 223 includes a normal termination status and an error termination status as its status and indicates the present status by setting a flag to the respective statuses. A flag is set to the normal termination status when the test by the testing units 124A and 124B results in normal termination. Moreover, a flag is set to the error termination status when the test by the testing units 124A and 124B results in abnormal termination. The synchronous communication status 224 is the same as the case of the startup synchronization data frame 210 although the names are partially different.

Moreover, as for the startup synchronization data frame 210 and the termination synchronization data frame 220, the 1's complement 212 of the startup ID, the 1's complement 222 of the termination ID, and the checksums 215 and 225 are provided to increase reliability of data transmitted and received, and may be not provided. Further, another field may be added.

When transmitting the startup synchronization data frame 210, the communication units 122A and 122B store values generated by the random number generating units 123A and 123B in the startup random value 213, transmit the startup synchronization data frame 210 at predetermined intervals of time (for example, at intervals of one second), and receive the startup synchronization data frame 210 from the counterpart SSDs 10B and 10A in the meantime. Further, the communication units 122A and 122B update the synchronous communication status according to a reception state of the startup synchronization data frame 210. A period that is sufficiently longer than the time required for transmitting one startup synchronization data frame 210 is set as a period in which a startup synchronization process is tried, and when it is not possible to terminate the synchronous communication process within this period, the synchronization process is terminated while regarding the process as a timeout error.

Moreover, when transmitting the termination synchronization data frame 220, the communication units 122A and 122B reflect a termination state corresponding to the test result obtained from the testing units 124A and 124B in the execution status 223, transmit the termination synchronization data frame 220 at predetermined intervals of time (for example, at intervals of one second), and receive the termination synchronization data frame 220 from the counterpart SSDs 10B and 10A in the meantime. Further, the communication units 122A and 122B update the synchronous communication status according to a reception state of the termination synchronization data frame 220. In the termination synchronous communication process, since there is a variation in the execution time of the test process by the respective SSDs 10A and 10B, a timeout error is not provided.

The random number generating units 123A and 123B have a function of generating a random number during the startup synchronization process. The generated number is transferred to the communication units 122A and 122B.

The testing units 124A and 124B execute a self-test process on a memory in the subject SSD after the communication units 122A and 122B terminate the startup synchronization process. A process of generating a test pattern and comparing an output thereof with an expected value is performed as the self-test process, for example. It is assumed that the two SSDs 10A and 10B provided in the printed substrate 2 execute the same self-test process. Moreover, the testing unit 124A and 124B compare the startup random value 213 included in the startup synchronization data frame 210 which is generated by the random number generating units 123A and 123B during the startup synchronization process and transmitted from the communication units 122A and 122B to the counterpart SSDs 10B and 10A with the startup random value 213 included in the startup synchronization data frame 210 received from the counterpart SSDs 10B and 10A, and determine whether the subject SSD is a master or a slave. For example, an SSD having the larger startup random value 213 may be set as the master. The testing unit 124A and 124B generate comprehensive test result information from the test results of the subject SSD and the counterpart SSD and notify the status output units 125A and 125B of the comprehensive test result information.

FIG. 4 is a view illustrating an example of the comprehensive test result information. The comprehensive test result is determined based on the combination of a test result of the subject SSD and a test result of the counterpart SSD. In this example, when the test results of the subject SSD and the counterpart SSD are both normal termination, the comprehensive test result is normal termination. In other cases, the comprehensive test result is error termination.

The status output units 125A and 125B are test result output units that output a status signal corresponding to a comprehensive test result acquired from the testing units 124A and 124B when the subject SSD is the master. An external output device 32 is connected to the status output units 125A and 125B via wires. A light emitting diode (LED), for example, can be used as the external output device 32. When an LED is used, by using a signal line that serves as an open drain output, it is possible to change a lighting state of the LED according to the comprehensive test result of FIG. 4 and to easily check the lighting state with the naked eyes of the user. Moreover, when a personal computer is used as the external output device 32, by providing the function of UART to the status output units 125A and 125B and connecting the external output device 32 to the status output units 125A and 125B, it is possible to output the comprehensive test result via serial communication. When the subject SSD is a slave, a high impedance state is created so that a status signal is not output from the status output units 125A and 125B.

Next, a test method of the memory system 1 having such a configuration will be described. In a test method of the memory system 1, when power is supplied from the outside to the memory system 1, a startup synchronization process which is a first synchronization process is executed with this event as a trigger. When the startup synchronization process is completed, a self-test process is executed, and a monitoring process during the self-test is performed in the meantime. Moreover, when the self-test is terminated, or when a counterpart SSD results in error termination in the monitoring process during the self-test, a termination synchronization process which is a second synchronization process is executed. Thus, in the following description, the details of the startup synchronization process, the termination synchronization process, and the monitoring process during the self-test will be described in order.

<Startup Synchronization Process>

Figure 5:
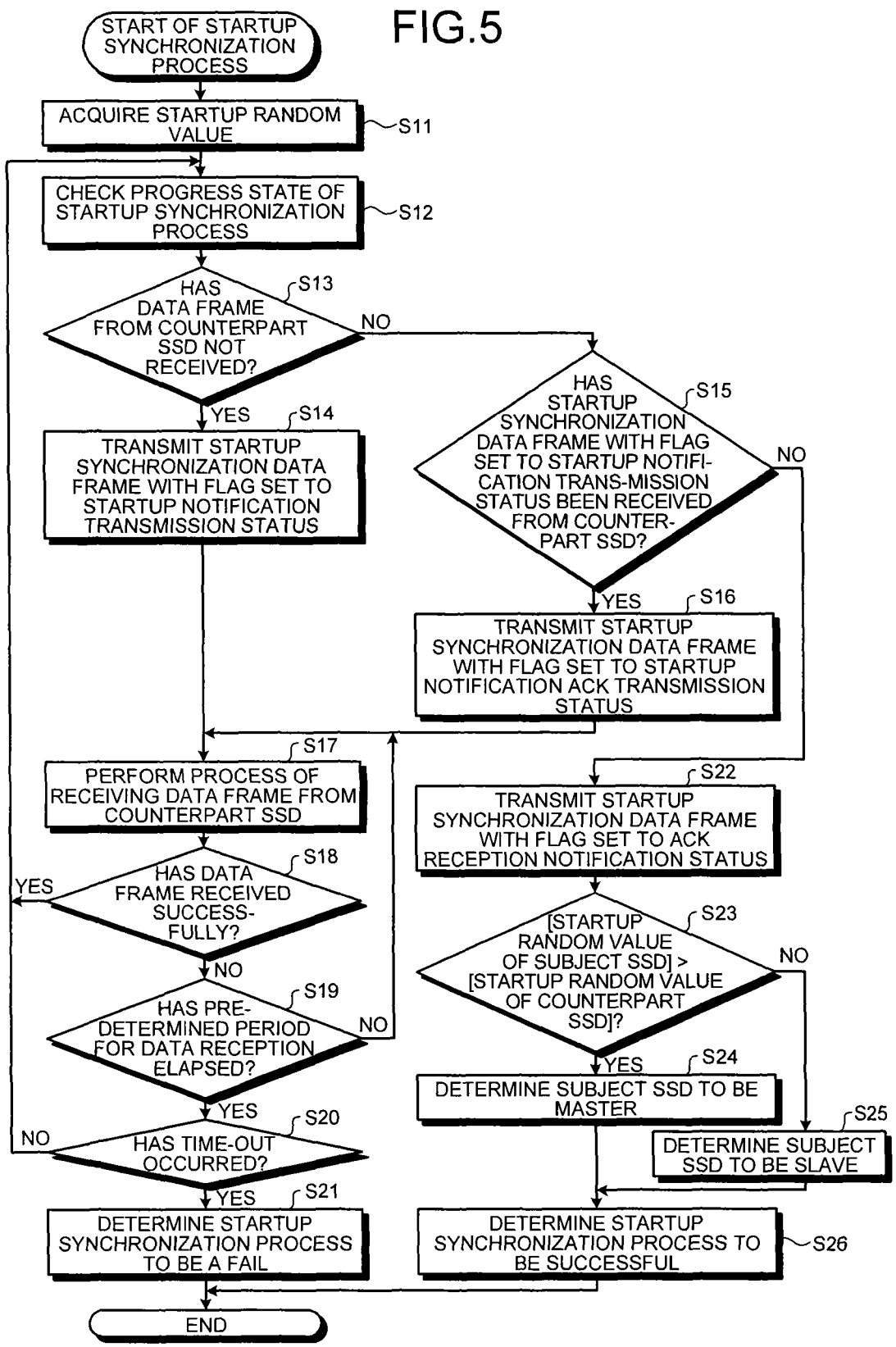
FIG. 5 is a flowchart illustrating an example of the flow of a startup synchronization process.

FIG. 5 is a flowchart illustrating an example of the flow of the startup synchronization process. First, when power is supplied to the memory system 1, the communication units 122A and 122B of the SSDs 10A and 10B acquire a value generated by the random number generating units 123A and 123B as the startup random value 213 (step S11) and check a progress state of the startup synchronization process (step S12). The process of checking the progress state of the startup synchronization process involves checking whether the startup synchronization data frame 210 is not received from the counterpart SSD, whether the startup synchronization data frame 210 in which a flag is set to the startup notification transmission status is received from the counterpart SSD, and whether the startup synchronization data frame 210 in which a flag is set to the startup notification ACK transmission status is received from the counterpart SSD.

When a data frame has not been received from the counterpart SSD (Yes in step S13), the communication units 122A and 122B transmit the startup synchronization data frame 210 which have the startup random value 213 acquired in step S11 and in which a flag is set to the startup notification transmission status to the counterpart SSD (step S14). Moreover, when the data frame has been received from the counterpart SSD (No in step S13) and when the startup synchronization data frame 210 in which a flag is set to the startup notification transmission status has been received from the counterpart SSD (Yes in step S15), the startup synchronization data frame 210 in which a flag is set to the startup notification ACK transmission status is transmitted to the counterpart SSD (step S16).

After that, a process of receiving the data frame from the counterpart SSD is performed (step S17). This receiving process is performed in a predetermined period after the startup synchronization data frame 210 is transmitted in step S14 or S16. Moreover, it is determined whether the data frame has been received successfully (step S18). As for the received data frame, (A) when data received for the first time is data other than the startup ID 211, (B) when data received subsequently to the startup ID 211 is not the 1's complement 212 of the startup ID, or (C) when the checksums 215 are not identical, it is determined that the data frame has not been received successfully. When the data frame illustrated in FIGS. 3A and 3B does not have the 1's complement 212 of the startup ID and the checksum 215, the conditions of (B) and (C) are not necessary.

When the data frame has been received successfully (Yes in step S18), the flow returns to step S12. In this case, since the startup synchronization data frame 210 is received from the counterpart SSD, the content of the startup synchronization data frame 210 transmitted presently is different from that of the startup synchronization data frame 210 transmitted previously.

Moreover, when the data frame has not been received successfully (No in step S18), the received data frame is discarded. After that, it is determined whether a predetermined period has elapsed after the data receiving process starts (step S19), and when the predetermined period has not elapsed (No in step S19), the flow returns to step S17. After that, when the predetermined period has elapsed (Yes in step S19), it is determined whether a predetermined period used for determining whether the synchronization process results in a fail has elapsed (time-out) from the start of the startup synchronization process (step S20). When the predetermined period has not elapsed from the start of the startup synchronization process (No in step S20), the flow returns to step S12. In this case, the same startup synchronization data frame 210 as the previous one is transmitted. Moreover, when the predetermined period has elapsed from the start of the startup synchronization process (Yes in step S20), that is, when it is not possible to receive the startup synchronization data frame 210 in which a flag is set to the ACK reception notification status described above from the counterpart SSD after the start of the startup synchronization process, the communication units 122A and 122B determines that the startup synchronization process results in a fail (step S21), and the process ends.

On the other hand, in step S15 when the startup synchronization data frame 210 in which a flag is set to the startup notification transmission status is not received from the counterpart SSD (No in step S15), the startup synchronization data frame 210 in which a flag is set to the ACK reception notification status is received from the counterpart SSD, and the communication units 122A and 122B transmit the startup synchronization data frame 210 in which a flag is set to the ACK reception notification status to the counterpart SSD (step S22). When the startup synchronization data frame 210 in which a flag is set to the startup notification transmission status is not received from the counterpart SSD in step S15, it is preferable to check whether the ACK reception notification status has been received.

After that, the communication units 122A and 122B determine whether the startup random value 213 of the subject SSD acquired in step S11 is larger than the startup random value 213 of the counterpart SSD included in the startup synchronization data frame 210 (step S23). When the startup random value 213 of the subject SSD is larger than the startup random value 213 of the counterpart SSD included in the startup synchronization data frame 210 (Yes in step S23), the communication units 122A and 122B determine that the subject SSD is the master (step S24). When the startup random value 213 of the subject SSD is smaller than the startup random value 213 of the counterpart SSD included in the startup synchronization data frame 210 (No in step S23), the communication units 122A and 122B determine that the subject SSDs 10A and 10B are the slaves (step S25). When the two startup random values 213 are the same, the above process may be repeatedly performed. When it is determined that the subject SSDs are the masters, the output of the operation status can be controlled by the status output units 125A and 125B of the master SSDs. After that, it is determined that the startup synchronization process results in a success (step S26), and the startup synchronization process ends.

Figure 6:
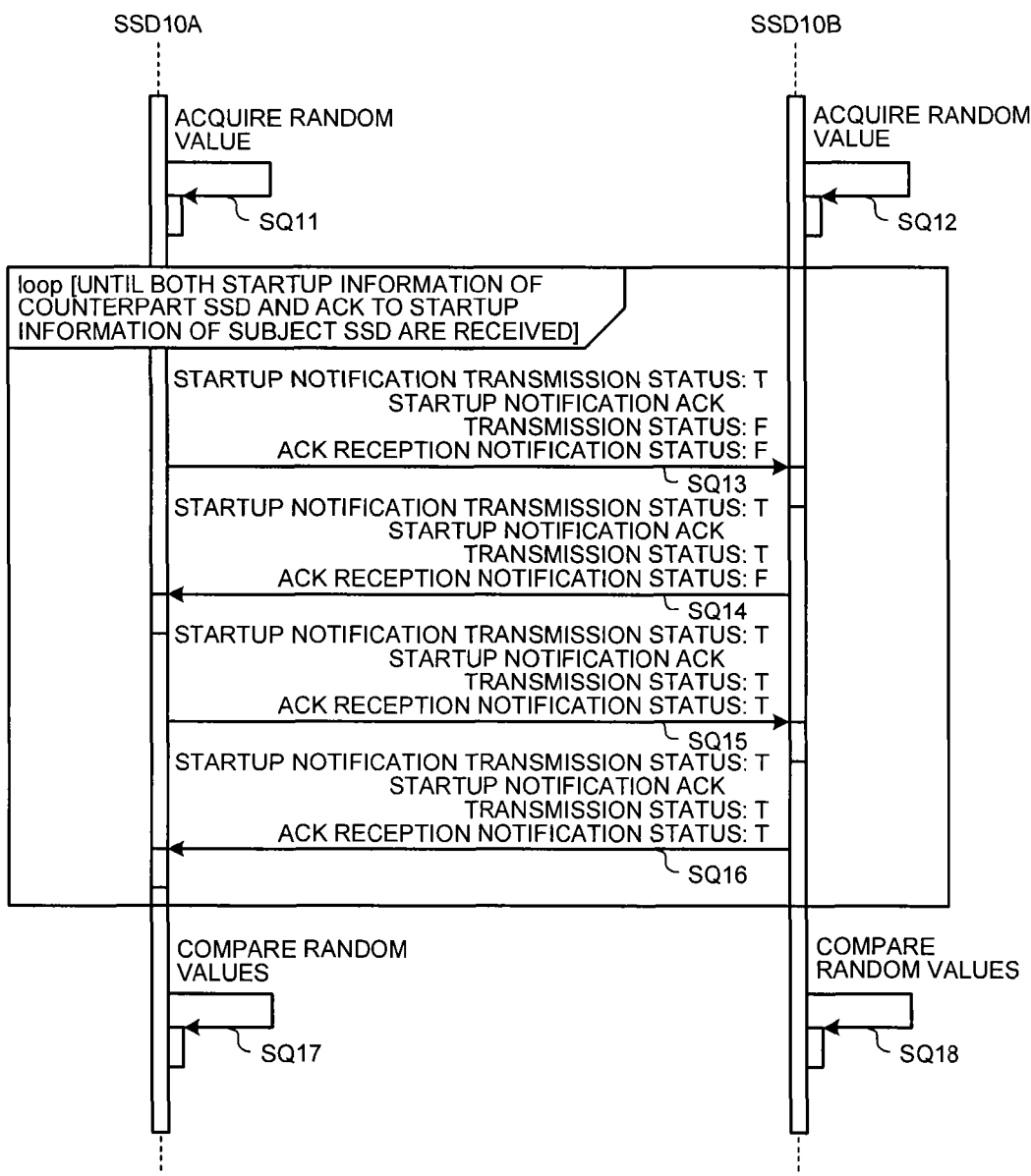
FIG. 6 is a sequence diagram illustrating an example of the flow of a startup synchronization process.

FIG. 6 is a sequence diagram illustrating an example of the flow of the startup synchronization process. When power is supplied to the memory system 1, the random number generating units 123A and 123B of the SSDs 10A and 10B generate random numbers, and the communication units 122A and 122B acquire the generated random numbers (SQ11 and SQ12). The communication unit 122A of the SSD 10A generates the startup synchronization data frame 210 in which the acquired random number as the startup random value 213 is set and a flag is set to only the startup notification transmission status as the synchronous communication status (in the figure, a state where a flag is set is depicted by "T" (which means true) and a state where a flag is not set is depicted by "F" (which means false)), and transmits the startup synchronization data frame 210 to the SSD 10B (SQ13). After the transmission, the communication unit 122A of the SSD 10A performs a receiving process for a predetermined period.

Upon receiving the startup synchronization data frame 210 in which a flag is set to only the startup notification transmission status as the synchronous communication status when performing a receiving process, the communication unit 122B of the SSD 10B generates the startup synchronization data frame 210 in which the acquired random number as the startup random value 213 is set and a flag is set to the startup notification transmission status and the startup notification ACK transmission status as the synchronous communication status, and transmits the startup synchronization data frame 210 to the SSD 10A (SQ14). After the transmission, the communication unit 122B of the SSD 10B performs a receiving process for a predetermined period.

Upon receiving the startup synchronization data frame 210 in which a flag is set to the startup notification transmission status and the startup notification ACK transmission status as the synchronous communication status when performing the receiving process, the communication unit 122A of the SSD 10A generates the startup synchronization data frame 210 in which a flag is set to the startup notification transmission status, the startup notification ACK transmission status, and the ACK reception notification status as the synchronous communication status and transmits the startup synchronization data frame 210 to the SSD 10B (SQ15).

Upon receiving the startup synchronization data frame 210 in which a flag is set to the startup notification transmission status, the startup notification ACK transmission status, and the ACK reception notification status as the synchronous communication status when performing the receiving process, the communication unit 122B of the SSD 10B generates the startup synchronization data frame 210 in which a flag is set to the startup notification transmission status, the startup notification ACK transmission status, and the ACK reception notification status as the synchronous communication status and transmits the startup synchronization data frame 210 to the SSD 10A (SQ16).

In this example, since the SSDs 10A and 10B are both in a state where a flag is set to the startup notification transmission status, the startup notification ACK transmission status, and the ACK reception notification status, the process ends there. However, when it is not possible to smoothly receive the data frame, the processes of SQ13 to SQ16 are performed until ACKs to both the startup information of the counterpart SSD and the startup information of the subject SSD are received.

After that, the testing unit 124A of the SSD 10A compares the startup random value 213 acquired in SQ11 with the startup random value 213 acquired from the startup synchronization data frame 210 of the SSD 10B and determines whether the subject SSD is a master or a slave (SQ17). In the SSD 10B, it is also determined that the subject SSD is a master or a slave (SQ18). In this manner, the startup synchronization process ends.

After the startup synchronization process described above end normally, the testing units 124A and 124B of the SSDs 10A and 10B start the self-test process. Since this self-test process has been performed in the related art, description thereof will not be provided.

<Termination Synchronization Process>

Figure 7:
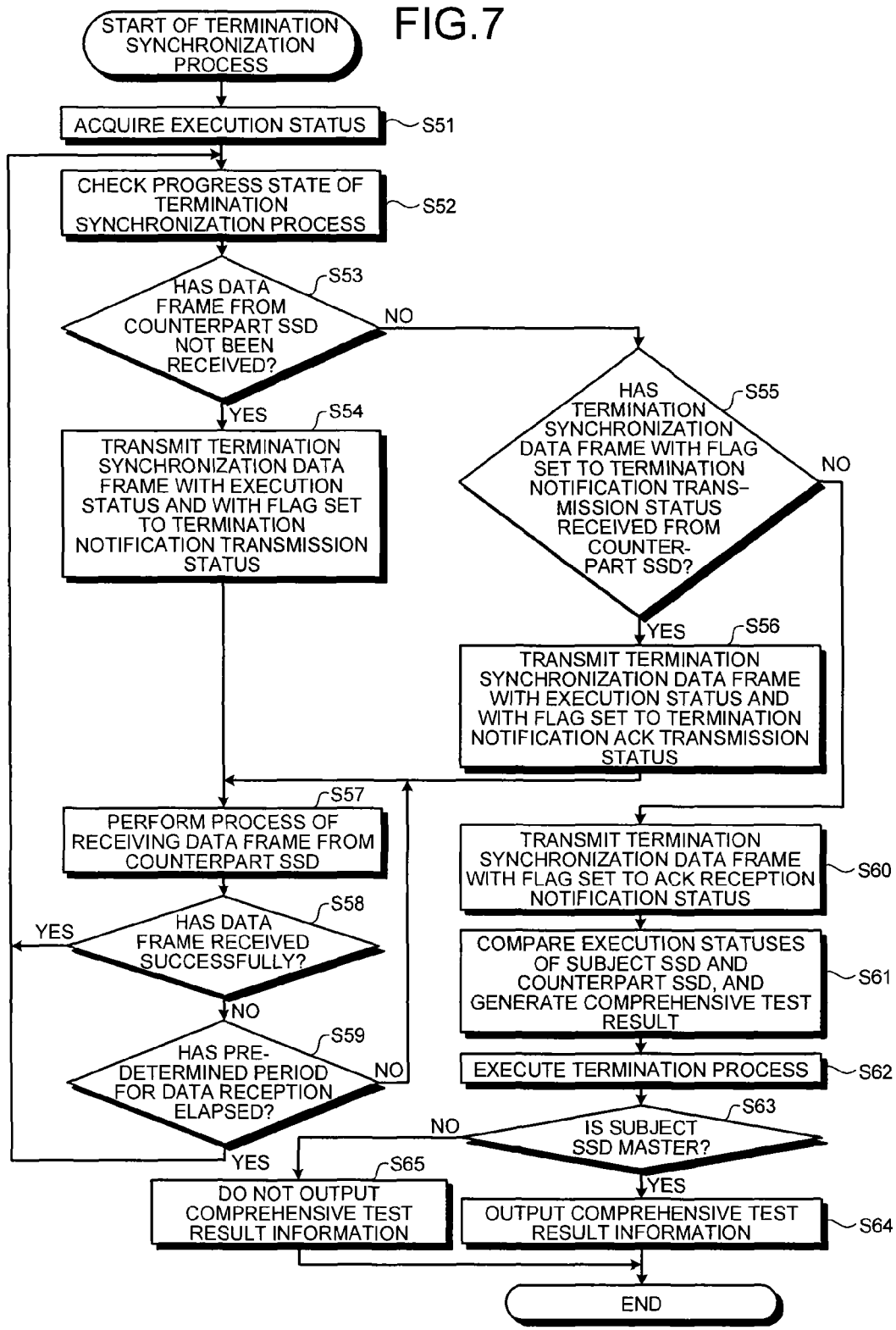
FIG. 7 is a flowchart illustrating an example of the flow of a termination synchronization process.

FIG. 7 is a flowchart illustrating an example of the flow of the termination synchronization process. The termination synchronization process is executed when the self-test processes of the testing units 124A and 124B of the SSDs 10A and 10B end. First, when the self-test process of the testing units 124A and 124B ends, the communication units 122A and 122B of the SSDs 10A and 10B acquire the result of the self-test process from the testing units 124A and 124B as the execution status 223 (step S51) and check a progress state of the termination synchronization process (step S52). The process of checking the progress state of the termination synchronization process involves checking whether the termination synchronization data frame 220 is not received from the counterpart SSDs 10A and 10B, whether the termination synchronization data frame 220 in which a flag is set to only the termination notification transmission status is received from the counterpart SSDs 10A and 10B, and whether the termination synchronization data frame 220 in which a flag is set to the termination notification ACK transmission status is received from the counterpart SSDs 10A and 10B.

When a data frame has not been received from the counterpart SSD (Yes in step S53), the communication units 122A and 122B transmit the termination synchronization data frame 220 which have the execution status 223 of the test result acquired in step S51 and in which a flag is set to the termination notification transmission status to the counterpart SSD (step S54). Moreover, when the data frame has been received from the counterpart SSD (No in step S53) and when the termination synchronization data frame 220 in which a flag is set to the termination notification transmission status has been received from the counterpart SSD (Yes in step S55), the communication units 122A and 122B transmit the termination synchronization data frame 220 which have the execution status 223 of the test result acquired in step S51 and in which a flag is set to the termination notification ACK transmission status to the counterpart SSD (step S56).

After that, a process of receiving the data frame from the counterpart SSD is performed (step S57). This receiving process is performed in a predetermined period after the termination synchronization data frame 220 is transmitted in step S54 or S56. Moreover, it is determined whether the data frame has been received successfully (step S58). As for the received data frame, (D) when data received for the first time is data other than the termination ID 221, (E) when data received subsequently to the termination ID 221 is not the 1's complement 222 of the termination ID, or (F) when the checksums 225 are not identical, it is determined that the data frame has not been received successfully. When the data frame illustrated in FIGS. 3A and 3B does not have the 1's complement 222 of the termination ID and the checksum 225, the conditions of (E) and (F) are not necessary.

When the data frame has been received successfully (Yes in step S58), the flow returns to step S52. In this case, since the startup synchronization data frame 210 is received from the counterpart SSD, the content of the startup synchronization data frame 210 transmitted presently is different from that of the startup synchronization data frame 210 transmitted previously.

Moreover, when the data frame has not been received successfully (No in step S58), the received data frame is discarded. After that, it is determined whether a predetermined period has elapsed after the data receiving process starts (step S59), and when the predetermined period has not elapsed (No in step S59), the flow returns to step S57. After that, when the predetermined period has elapsed (Yes in step S59), the flow returns to step S52. In this case, the same startup synchronization data frame 210 as the previous one is transmitted.

On the other hand, when the termination synchronization data frame 220 in which a flag is set to the termination notification transmission status is not received from the counterpart SSD (No in step S55), the termination synchronization data frame 220 in which a flag is set to the ACK reception notification status is received from the counterpart SSD, and the communication units 122A and 122B transmit the termination synchronization data frame 220 in which a flag is set to the ACK reception notification status to the counterpart SSD (step S60). When the termination synchronization data frame 220 in which a flag is set to the termination notification transmission status is not received from the counterpart SSD in step S55, it is preferable to check whether the ACK reception notification status has been received.

After that, the testing units 124A and 124B compare the execution status 223 (test result) acquired in the self-test process of the subject SSD with the execution status 223 (test result) in the termination synchronization data frame 220 of the counterpart SSD, generate the comprehensive test result information (step S61), and transfer the result to the status output units 125A and 125B.

When the SSDs 10A and 10B complete transmission of the termination synchronization data frame 220 in which a flag is set to the ACK reception notification status, it is regarded that the synchronization process terminates normally, and a termination process is performed (step S62). When the subject SSD is a master (Yes in step S63), the status output units 125A and 125B output the comprehensive test result information to an external device such as an LED (step S64), and a termination synchronization process ends. When the comprehensive test result information is output to the LED, the LED is lit according to a predetermined LED lighting method corresponding to the comprehensive test result. As a result, an operator can easily determine whether the tested memory system 1 can be used as a product by seeing the LED with the naked eyes. Moreover, when the subject SSD is a slave (No in step S63), the status output units 125A and 125B do not output the comprehensive test result information to an external device (step S65), and the termination synchronization process ends. After that, a subsequent termination process is performed.

Figure 8:
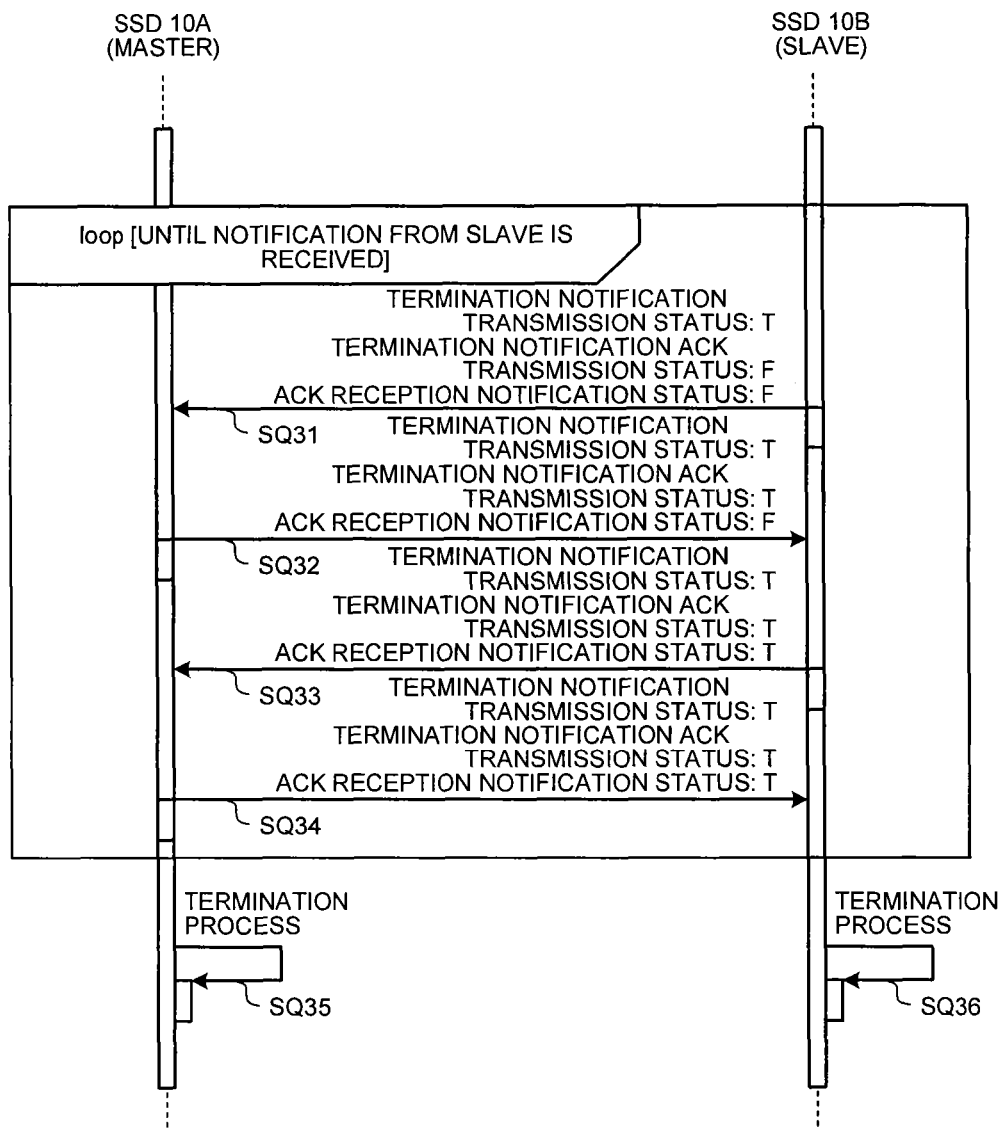
FIG. 8 is a sequence diagram illustrating an example of the flow of a termination synchronization process.

FIG. 8 is a sequence diagram illustrating an example of the flow of the termination synchronization process. In this example, it is assumed that the SSD 10A is a master, and the SSD 10B is a slave. When the self-test process of the SSDs 10A and 10B results in normal termination or error termination, the termination synchronization process starts. In this example, the communication unit 122B of the SSD 10B generates the termination synchronization data frame 220 in which the execution status 223 (normal termination or error termination) of the test result is set and a flag is set to the termination notification transmission status as the synchronous communication status 224, and transmits the termination synchronization data frame 220 to the SSD 10A (SQ31). After the transmission, the communication unit 122B of the SSD 10B performs a receiving process for a predetermined period.

Upon receiving the termination synchronization data frame 220 in which a flag is set to only the termination notification transmission status as the synchronous communication status 224 when performing the receiving process, the communication unit 122A of the SSD 10A generates the termination synchronization data frame 220 in which the execution status 223 of the test result of the subject SSD is set and a flag is set to the termination notification transmission status and the termination notification ACK transmission status as the synchronous communication status 224, and transmits the termination synchronization data frame 220 to the SSD 10B (SQ32). After the transmission, the communication unit 122A of the SSD 10A performs a receiving process for a predetermined period.

Upon receiving the termination synchronization data frame 220 in which a flag is set to the termination notification transmission status and the termination notification ACK transmission status as the synchronous communication status 224 when performing a receiving process, the communication unit 122B of the SSD 10B generates the termination synchronization data frame 220 in which a flag is set to the termination notification transmission status, the termination notification ACK transmission status, and the ACK reception notification status as the synchronous communication status 224 and transmits the termination synchronization data frame 220 to the SSD 10A (SQ33).

Upon receiving the termination synchronization data frame 220 in which a flag is set to the termination notification transmission status and the termination notification ACK transmission status as the synchronous communication status 224 when performing a receiving process, the communication unit 122A of the SSD 10A generates the termination synchronization data frame 220 in which a flag is set to the termination notification transmission status, the termination notification ACK transmission status, and the ACK reception notification status as the synchronous communication status 224 and transmits the termination synchronization data frame 220 to the SSD 10B (SQ34).

In this example, since the SSDs 10A and 10B are both in a state where a flag is set to the termination notification transmission status, the termination notification ACK transmission status, and the ACK reception notification status, the process ends there. However, when it is not possible to smoothly receive the data frame, the processes of SQ31 to SQ34 are performed until a notification is received from the slave SSD 10B.

After that, although both SSDs 10A and 10B perform a termination process (SQ35 and SQ36), the status output unit 125A of the master SSD 10A outputs the test result of the subject SSD and the comprehensive test result obtained from the test result of the counterpart SSD 10B to the external device. In this manner, the termination synchronization process ends. Moreover, in the slave SSD 10B, since the status output unit 125B is in a high impedance state, the comprehensive test result is not output from the status output unit 125B.

<Self-Test Monitoring Process>

Although the self-test process may be performed continuously without interruption from the start to the end, a break may be provided in the self-test process, for example, and the self-test process may be interrupted at the break. By interrupting the self-test process in this manner, when an error occurs in the previous test process, the termination synchronization process can be executed during the subsequent interruption process. Moreover, the counterpart SSD interrupts the self-test process for a predetermined period around the break of the test process and performs a process of monitoring whether the termination synchronization data frame has been received from the counterpart SSD. Moreover, when the termination synchronization data frame has not been received, the self-test process being interrupted is resumed. When the termination synchronization data frame has been received, the termination synchronization process is performed. It is assumed that the period in which the test process is interrupted at the break is longer than the interval in which each SSD transmits the data frame.

Figure 9A:
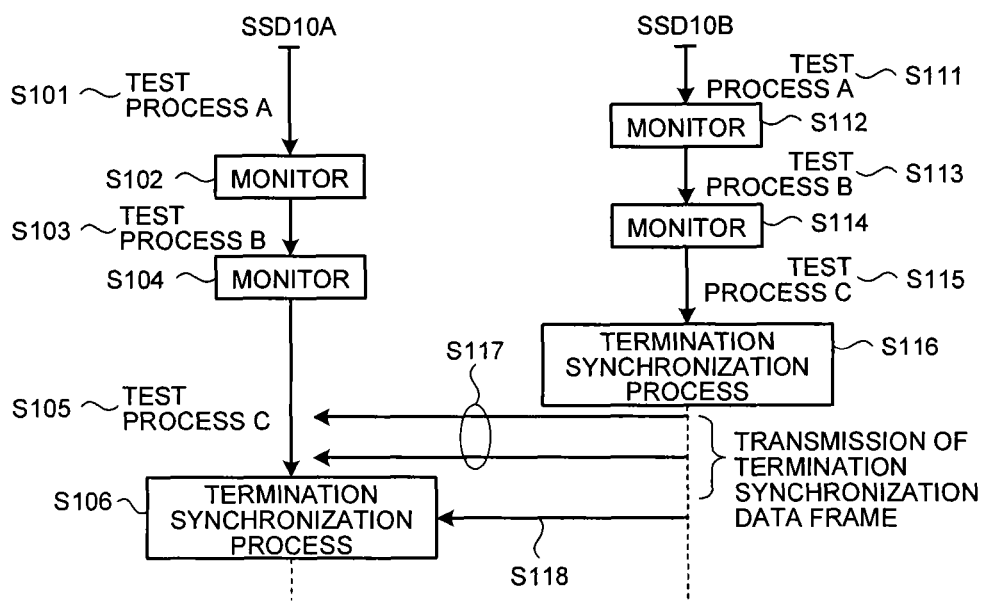
FIGS. 9A and 9B are views schematically illustrating the flow of processes from a self-test process to a termination synchronization process.
Figure 9B:
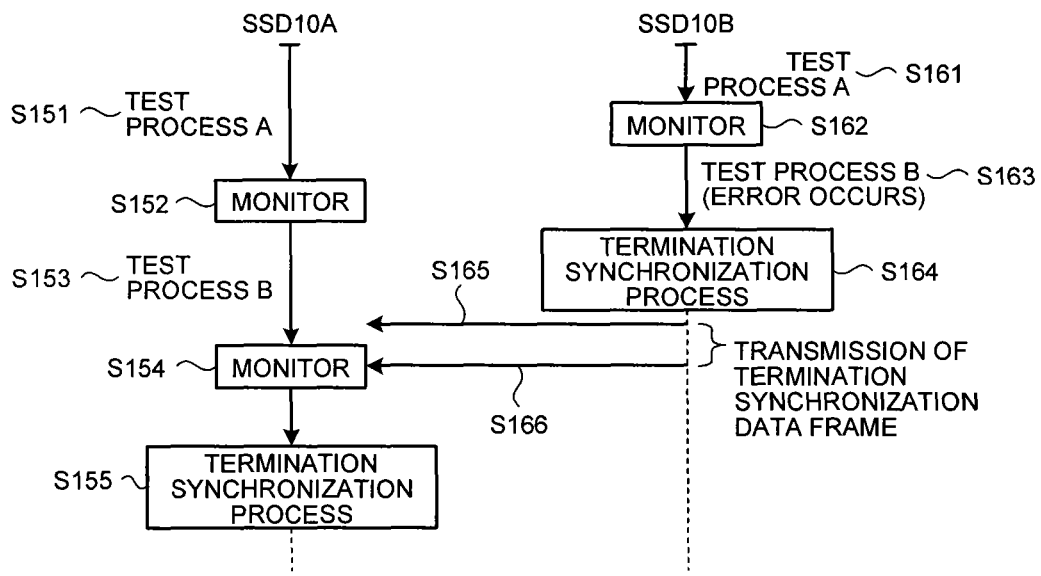

FIGS. 9A and 9B are views schematically illustrating the flow of processes from the self-test process and the termination synchronization process, in which FIG. 9A illustrates an example of the flow for normal termination, and FIG. 9B illustrates an example of the flow for error termination.

First, the flow for normal termination where the test process results in no error will be described. As illustrated in FIG. 9A, it is assumed that the self-test process is divided into test processes A to C. That is, the SSD 10A executes the test process A (step S101) and performs monitoring while temporarily interrupting the test process (step S102). Then, the SSD 10A executes the test process B (step S103) and performs monitoring while temporarily interrupting the test process (step S104). After that, the SSD 10A executes the test process C (step S105) and performs the termination synchronization process (step S106). Moreover, the SSD 10B executes the test process A (step S111) and performs monitoring while temporarily interrupting the test process (step S112). Then, the SSD 10B executes the test process B (step S113) and performs monitoring while temporarily interrupting the test process (step S114). After that, the SSD 10B executes the test process C (step S115) and performs the termination synchronization process (step S116).

However, the SSDs 10A and 10B execute the respective test processes A to C at different times. That is, in this example, the SSD 10B terminates the test process earlier than the SSD 10A, and executes the termination synchronization process of step S116. In this case, as described in FIG. 7, the SSD 10B sets the execution status 223 indicating that the process results in normal termination to the SSD 10A and transmits the termination synchronization data frame 220 in which a flag is set to only the termination notification transmission status as the synchronous communication status 224 to the SSD 10A at predetermined intervals of time (steps S117 to S118). However, the SSD 10A being executing the test process C of step S105 does not (cannot) receive the termination synchronization data frame 220 from the SSD 10B in step S117. Moreover, since the SSD 10A does not transmit the determination synchronization data frame 220 to the SSD 10B, the SSD 10B does not receive the termination synchronization data frame 220 from the SSD 10A during the receiving process after the termination synchronization data frame 220 is transmitted. As a result, as illustrated in FIG. 7, the SSD 10B continuously transmits the same termination synchronization data frame 220 to the SSD 10A at predetermined intervals of time.

Moreover, when the SSD 10A terminates the test process C of step S105 and executes the termination synchronization process of step S106, the termination synchronization data frame 220 transmitted from the SSD 10B in step S118 arrives at the SSD 10A, and the termination synchronization data frame 220 is transmitted to the SSD 10B, whereby the termination synchronization process described above is executed.

Next, the flow for error termination where the test process results in errors will be described. As illustrated in FIG. 9B, similarly to the case of FIG. 9A, it is assumed that the SSD 10A executes the test process in such an order that the SSD 10A executes the test process A (step S151) and performs monitoring while temporarily interrupting the test process (step S152), and then, the SSD 10A executes the test process B (step S153) and performs monitoring while temporarily interrupting the test process (step S154). Moreover, it is assumed that the SSD 10B executes the test process in such an order that SSD 10B executes the test process A (step S161)

and performs monitoring while temporarily interrupting the test process (step S162), and then, the SSD 10B executes the test process B (step S163).

When an error occurs in the test process B of the SSD 10B of step S163, the SSD 10B executes the termination synchronization process after the end of the test process B (step S164). The termination synchronization process is the same as described above. Moreover, as described in FIG. 7, the SSD 10B transmits the termination synchronization data frame 220 in which the execution status 223 indicating that the process results in error termination is set and a flag is set to only the termination notification transmission status as the synchronous communication status 224 to the SSD 10A (step S165). However, since the SSD 10A being transmitting the termination synchronization data frame 220 is still executing the test process B of step S153, the SSD 10A does not (cannot) receive the termination synchronization data frame 220 from the SSD 10B. Thus, the SSD 10B continuously transmits the same termination synchronization data frame 220 as above at predetermined intervals of time until the monitoring process of step S154 is executed after the test process B of the SSD 10A ends.

Moreover, when the test process B of step S153 ends, the SSD 10A receives the termination synchronization data frame 220 transmitted in step S166 from the SSD 10B during the monitoring process of step S154. After that, since the execution status 223 of the termination synchronization data frame 220 is in an error termination status, the subject SSD 10A also executes the termination synchronization process (step S155). As a result, termination synchronization is taken between the SSD 10B which has detected errors before and performed the termination synchronization process and the SSD 10A which is performing the self-test.

In this manner, a case where the termination synchronization process is executed in a state where the self-test process has not been completed occurs when the self-test process of the counterpart SSD results in error termination. In other cases where the self-test process of the counterpart SSD 10B results in normal termination, for example, when the SSD 10A has received the termination synchronization data frame 220 in which the execution status 223 indicating that the process results in normal termination is set in step S166 of FIG. 9B, the subsequent test process C is executed after the monitoring of step S154, and the self-test process is resumed. Moreover, when a valid data frame has not been received during the monitoring, the counterpart SSD is performing self-test and is in a state where the termination synchronization process has not started. In this case, the self-test process being interrupted is resumed.

In the above description, although a case where monitoring is performed at the break of the process has been described, the reception state of the termination synchronization data frame 220 from the counterpart SSD may be monitored at an optional point in time.

As described above, in this embodiment, two SSDs 10A and 10B having a self-test function are disposed on one printed substrate 2 and connected by wires so that bidirectional communication can be performed. The SSDs 10A and 10B send self-test results to each other, and the comprehensive test result which is the self-test result of the two SSDs 10A and 10B is sent from one SSD 10A or 10B to the outside. Thus, an advantage that the comprehensive test result of the two SSDs 10A and 10B can be checked based on one signal is obtained.

Moreover, since the process of receiving the termination synchronization data frame 220 from the counterpart SSD is monitored at an optional point in time, when an error occurs in the test process of one SSD, the test process of the SSD is stopped, the termination synchronization process is performed, and the information thereof is also sent to the other SSD. Thus, an advantage that the other SSD can stop the test process at the point in time when the information is received without waiting until the test process is completed is obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    two storage devices, the two storage devices each including a storage unit and a controller, each of the controllers being configured to transmit data between a host device and the storage unit, and the two storage devices being connected via a communication line so that bidirectional communication can be performed, wherein
    each of the controllers includes:
        a testing unit that performs a self-test process on the storage unit connected to the controller;
        a communication unit that performs communication with another controller via the communication line; and
        a result output unit that outputs test results of the two storage devices obtained by the testing unit, wherein
        the communication unit performs a first synchronization process making the testing unit of each of the two storage devices execute the self-test process at a predetermined point, and a second synchronization process in which a termination synchronization frame including a test result of one of the storage devices including the controller is transmitted to another one of the storage devices via the communication line after the self-test process is terminated and the termination of the self-test process is synchronized between the two storage devices,
        the testing unit performs a comprehensive test result determination process of obtaining a comprehensive test result from the test result of the one storage device and the test result of the other one of the storage devices obtained in the second synchronization process, and
    the result output unit of either one of the two storage devices outputs the comprehensive test result obtained by the testing unit.

2. The memory system according to claim 1, wherein
    the storage device further includes a random number generating unit that generates a random number,
    the communication unit transmits a random number generated by the random number generating unit in the first synchronization process to the other one of the storage devices as a random value and determines whether the storage device is a master or a slave using the random value and a random value received from the other one of the storage devices, and
    the comprehensive test result is output by the result output unit of the storage device that is determined to be the master.

3. The memory system according to claim 1, wherein
the testing unit determines the comprehensive test result to be error termination when any one of the two storage devices results in error termination and determines the comprehensive test result to be normal termination when both storage devices result in normal termination.

4. The memory system according to claim 1, wherein
the second synchronization process is executed when the self-test process is terminated normally or when the self-test process results in error termination.

5. The memory system according to claim 1, wherein
the testing unit interrupts the self-test process at a predetermined point in time, and
the communication unit further performs a process of monitoring whether a frame has been received from the other one of the storage devices during the interruption of the self-test process.

6. The memory system according to claim 5, wherein
when the termination synchronization frame indicating error termination is received from the other one of the storage devices, the testing unit terminates the self-test process, and
the communication unit performs the second synchronization process after the interruption of the self-test process.

7. The memory system according to claim 5, wherein
when a frame is not received from the other one of the storage devices during the interruption of the self-test process, or when the termination synchronization frame indicating normal termination is received from the other one of the storage devices, the testing unit executes a subsequent self-test process after the interruption of the self-test process.

8. The memory system according to claim 1, wherein
the storage unit includes a nonvolatile semiconductor memory device.

9. The memory system according to claim 1, wherein
the communication line includes two serial communication lines.

10. The memory system according to claim 1, wherein
the two storage devices are disposed on one printed substrate, and
the other one of the storage devices is disposed on one principal surface of the printed substrate, and the one storage device is disposed on the other principal surface of the printed substrate.

11. The memory system according to claim 1, wherein
the communication unit communicates, during the first synchronization process, a frame including a synchronous communication status that indicates a transmission state of a startup notification of the one storage device, a first response notification to the startup notification, and a second response notification to the first response notification between the two storage devices, and
the communication unit performs the first synchronization process until the second response notification to the startup notification of the one storage device and the other one of the storage devices is received.

12. The memory system according to claim 1, wherein
the communication unit communicates, during the second synchronization process,
the termination synchronization frame including a synchronous communication status that indicates a transmission state of a termination notification of the one storage device, a third response notification to the termination notification, and a fourth response notification to the third response notification between the two storage devices, and
the communication unit of a storage device that outputs the comprehensive test result performs the second synchronization process until the fourth response notification is received from the other one of the storage devices.

13. A test method of a memory system, where the memory system includes two storage devices, the two storage devices each including a storage unit and a controller, each of the controllers being configured to transmit data between a host device and the storage unit, the two storage devices being connected via a communication line so that bidirectional communication can be performed when the two storage devices are disposed on a printed substrate, the method comprising:
performing a first synchronization process between the two storage devices via the communication line when power is supplied to the memory system;
executing a self-test process in each of the two storage devices after termination of the first synchronization process;
performing a second synchronization process of allowing the two storage devices to communicate a termination synchronization frame including a test result of one of the two storage devices to each other via the communication line after termination of the self-test to synchronize the termination of the self-test process between the two storage devices;
obtaining a comprehensive test result from the test result of the one of the two storage devices and the test result of another one of the storage devices obtained in the second synchronization process; and
outputting the comprehensive test result by either one of the two storage devices.

14. The test method of the memory system according to claim 13, wherein
in the first synchronization process, the two storage devices send generated random values to each other and determine which one of the two storage devices is a master or a slave using the random values, and
in the outputting the comprehensive test result, a storage device that is determined to be the master outputs the comprehensive test result.

15. The test method of the memory system according to claim 13, wherein
in the outputting the comprehensive test result, the one of the two storage devices determines the comprehensive test result to be error termination when any one of the two storage devices results in error termination and determines the comprehensive test result to be normal termination when both storage devices result in normal termination.

16. The test method of the memory system according to claim 13, wherein
the executing the self-test process further includes interrupting the self-test process at a predetermined point in time and performing a monitoring process of monitoring whether a frame has been received from the other one of the two storage devices.

17. The test method of the memory system according to claim 16, wherein
when the termination synchronization frame indicating error termination is received from the other one of the two storage devices during the monitoring process of the executing the self-test process, the second synchronization process is performed after the monitoring process.

18. The test method of the memory system according to claim 16, wherein when the termination synchronization frame indicating normal termination is received from the other one of the two storage devices or when a frame is not received from the other one of the two storage devices during the monitoring process of the self-test process, a subsequent self-test process is executed after the monitoring process.

19. The test method of the memory system according to claim 13, wherein
in the first synchronization process, when it is not possible to complete the first synchronization process between the two storage devices within a predetermined period, a process subsequent to the first synchronization process is terminated by regarding that the first synchronization process results in a fail.

20. The test method of the memory system according to claim 13, wherein
the storage unit includes a nonvolatile semiconductor memory device.

* * * * *